(12) United States Patent
Lin

(10) Patent No.: US 7,832,886 B2
(45) Date of Patent: Nov. 16, 2010

(54) LIGHT EMITTING MODULE

(75) Inventor: Feng-Li Lin, Taishan Township, Taipei County (TW)

(73) Assignee: Gigno Technology Co., Ltd., Taipei (TW)

( * ) Notice: Subject to any disclaimer, the term of this patent is extended or adjusted under 35 U.S.C. 154(b) by 271 days.

(21) Appl. No.: 12/098,790

(22) Filed: Apr. 7, 2008

(65) Prior Publication Data

US 2008/0253107 A1 Oct. 16, 2008

(30) Foreign Application Priority Data

Apr. 16, 2007 (TW) .............................. 96113396 A

(51) Int. Cl.
*F21V 9/16* (2006.01)
*F21V 1/00* (2006.01)
*F21V 21/00* (2006.01)
*H01L 33/00* (2010.01)

(52) U.S. Cl. .................... 362/84; 362/249.02; 362/255; 257/99

(58) Field of Classification Search ................. 362/255, 362/602, 603, 612, 617, 84, 614, 249.02; 257/98–100

See application file for complete search history.

(56) References Cited

U.S. PATENT DOCUMENTS

| 5,583,350 | A * | 12/1996 | Norman et al. | 257/88 |
| 6,229,585 | B1 * | 5/2001 | Yanagi | 349/65 |
| 6,270,236 | B1 * | 8/2001 | Brussog | 362/235 |
| 2006/0157724 | A1 * | 7/2006 | Fujita | 257/99 |
| 2007/0018183 | A1 * | 1/2007 | Denbaars et al. | 257/98 |
| 2007/0201234 | A1 * | 8/2007 | Ottermann | 362/341 |

* cited by examiner

*Primary Examiner*—Stephen F Husar
*Assistant Examiner*—James W Cranson
(74) *Attorney, Agent, or Firm*—Birch, Stewart, Kolasch & Birch, LLP

(57) ABSTRACT

A light emitting module includes a transparent substrate and a plurality of light emitting diodes (LEDs). The transparent substrate has a first surface, a second surface disposed opposite to the first surface and a patterned conductive layer disposed on the first surface of the transparent substrate. The LEDs are disposed on a lateral side of the first surface and are electrically connected with the patterned conductive layer. Light outputted from the LEDs is guided by the transparent substrate and is outputted from the first surface or the second surface.

14 Claims, 7 Drawing Sheets

LIGHT EMITTING MODULE

CROSS REFERENCE TO RELATED APPLICATIONS

This Non-provisional application claims priority under 35 U.S.C. §119(a) on Patent Application No(s). 096113396 filed in Taiwan, Republic of China on Apr. 16, 2007, the entire contents of which are hereby incorporated by reference.

BACKGROUND OF THE INVENTION

1. Field of Invention

The invention relates to a light emitting module and, in particular, to a light emitting module having LEDs serving as light sources.

2. Related Art

A light emitting diode (LED) is a light emitting element made of semiconductor materials. When an extremely low voltage is applied across two electrode terminals of the LED, the redundant energy may be excited in the form of light according to the combination of electrons and holes.

Different from the typical incandescent light bulb, the LED pertains to the cold light emitting element and has the advantages of low power consumption, long lifetime, needlessness of the warm-up time and quick response speed. In addition, the LED has small size, can withstand vibration, is adapted to the mass production, and is adapted to the formation of the extremely small or array-type module according to the requirement of the application. Accordingly, the LED may be widely applied to indicators, advertising space and display devices of information, communication and consumer electronic products, and thus becomes the indispensable element in the daily life. Recently, the LED is further applied to a light source of the backlight module of a liquid crystal display (LCD) so as to gradually replace the conventional cold cathode fluorescent lamp (CCFL) to serve as the light source.

FIG. 1 is a schematic illustration showing a conventional side-edge backlight module 1. Referring to FIG. 1, the side-edge backlight module 1 includes a frame body 11, a plurality of LEDs 12, a circuit board 13, a light shield 14, a light guide plate 15 and a reflective sheet 16. The frame body 11 is a hollow rectangular frame body. The LEDs 12 are disposed on the circuit board 13, the circuit board 13 is vertically disposed in the light shield 14, and the light shield 14 is screwed to a lateral side of the frame body 11.

Referring to FIG. 2, the LED 12 has a chip 121, a lead frame 122 and a plastic housing 123. The chip 121 is disposed on the lead frame 122, and the plastic housing 123 covers one portion of the lead frame 122 with a lead L being exposed. The lead L of the LED 12 is adhered to the circuit board 13 by a conductive adhesive. The light outputted from the chip 121 is reflected to the plastic housing 123 by an inner wall of the plastic housing and a reflective layer on a surface of the lead frame 122.

The LEDs 12 are arranged in a row and disposed toward a light input surface 151 of the light guide plate 15. When the light rays outputted from the LEDs 12 enter the light guide plate 15 through the light input surface 151, the light rays are totally reflected inside the light guide plate 15 so as to achieve light mixing. When the light rays pass through printed dots on a bottom surface of the light guide plate 15, the light rays are scattered and the total reflection of the light rays is terminated. Thus, a portion of the light is refracted out of a light output surface 152 of the light guide plate 15, and then a plane light source can be formed.

However, when the side-edge backlight module 1 is being assembled, it is very difficult to align the LEDs 12 with the light input surface 151 of the light guide plate 15 because the sizes of the LEDs 12 are quite small and the height h of the light input surface 151 of the light guide plate 15 is also quite small. If the misalignment occurs, the light rays outputted from the LED 12 may not enter the light guide plate 15 so that the light emitting efficiency of the side-edge backlight module 1 is deteriorated. Furthermore, the light guide plate 15 is usually made of expensive resin, and the light guide plate 15 is formed by way of injection molding, so the cost of the side-edge backlight module 1 is also increased.

Furthermore, the light is mostly emitted from the bottom surface of the chip 121, and the reflective layer for reflecting the light is coated on the surface of the lead frame 122. Thus, most of the light can be emitted in a direction toward the top surface of the LED 12. However, the light availability is unavoidably decreased when the light is emitted out through the reflective layer so that the light emitting efficiency of the LED is decreased.

Therefore, it is an important subject to provide a light emitting module for solving the above-mentioned problems.

SUMMARY OF THE INVENTION

In view of the foregoing, the invention is to provide a light emitting module free from the problem that LEDs cannot be easily aligned with a light input surface of a light guide plate.

In addition, the invention is also to provide a light emitting module with enhanced light usage of the LED.

To achieve the above, the invention discloses a light emitting module including a transparent substrate and a plurality of light emitting diodes (LEDs). The transparent substrate has a first surface, a second surface disposed opposite to the first surface, and a patterned conductive layer disposed on the first surface. The LEDs are disposed on a lateral side of the first surface of the transparent substrate and electrically connected with the patterned conductive layer. The light emitted from the LEDs is guided by the transparent substrate and outputted from the first surface or the second surface.

As mentioned above, the light emitting module of the invention has the transparent substrate serving as the LED package substrate. Compared with the prior art, the light emitting module of the invention has the transparent substrate serving as the LED package substrate and the light guide plate. Therefore, the problem of the prior art that the alignment between the LEDs and the light guide plate cannot be easily achieved can be solved, and the material cost and the assembling time of the light emitting module can be decreased due to the decreased number of assembled members. Furthermore, in the light emitting module of the invention, the light outputted from the bottom surface of the LED chip directly penetrates through the transparent substrate and then enters the light guide plate, or directly penetrates through the first substrate body and then enters the second substrate body to form the plane light source. Because it is unnecessary to plate the reflective layer on the surface of the lead frame to reflect the light, the light availability is enhanced. In addition, the transparent substrate or the first substrate body in the light emitting module according to the embodiment of the invention is made of the glass material, which is cheaper than the conventional light guide plate.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

A light emitting module according to a first embodiment of the invention will be described with reference to FIGS. 3 to 6.

Figure 1:
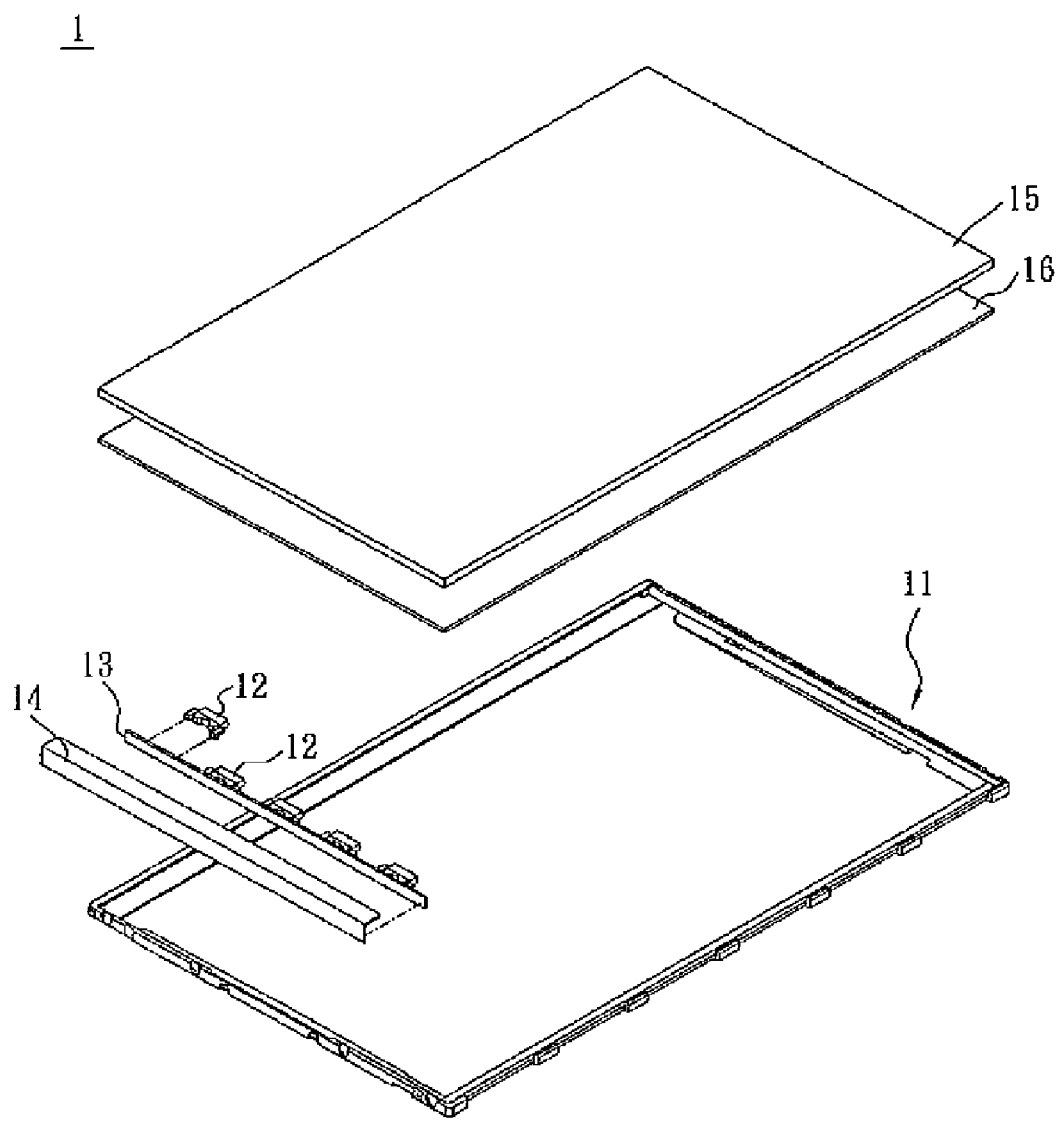
FIG. 1 is a schematic illustration showing a conventional side-edge backlight module.
Figure 2:
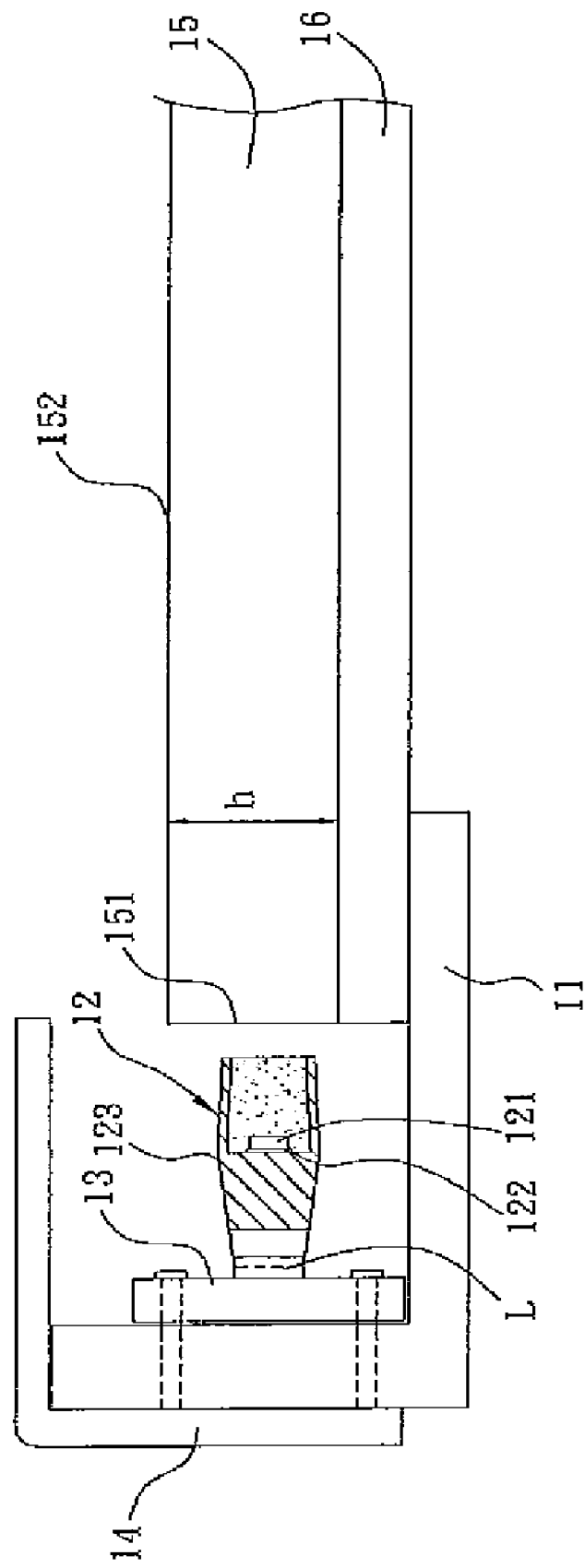
FIG. 2 is a cross-sectional view showing the side-edge backlight module of FIG. 1.
Figure 3:
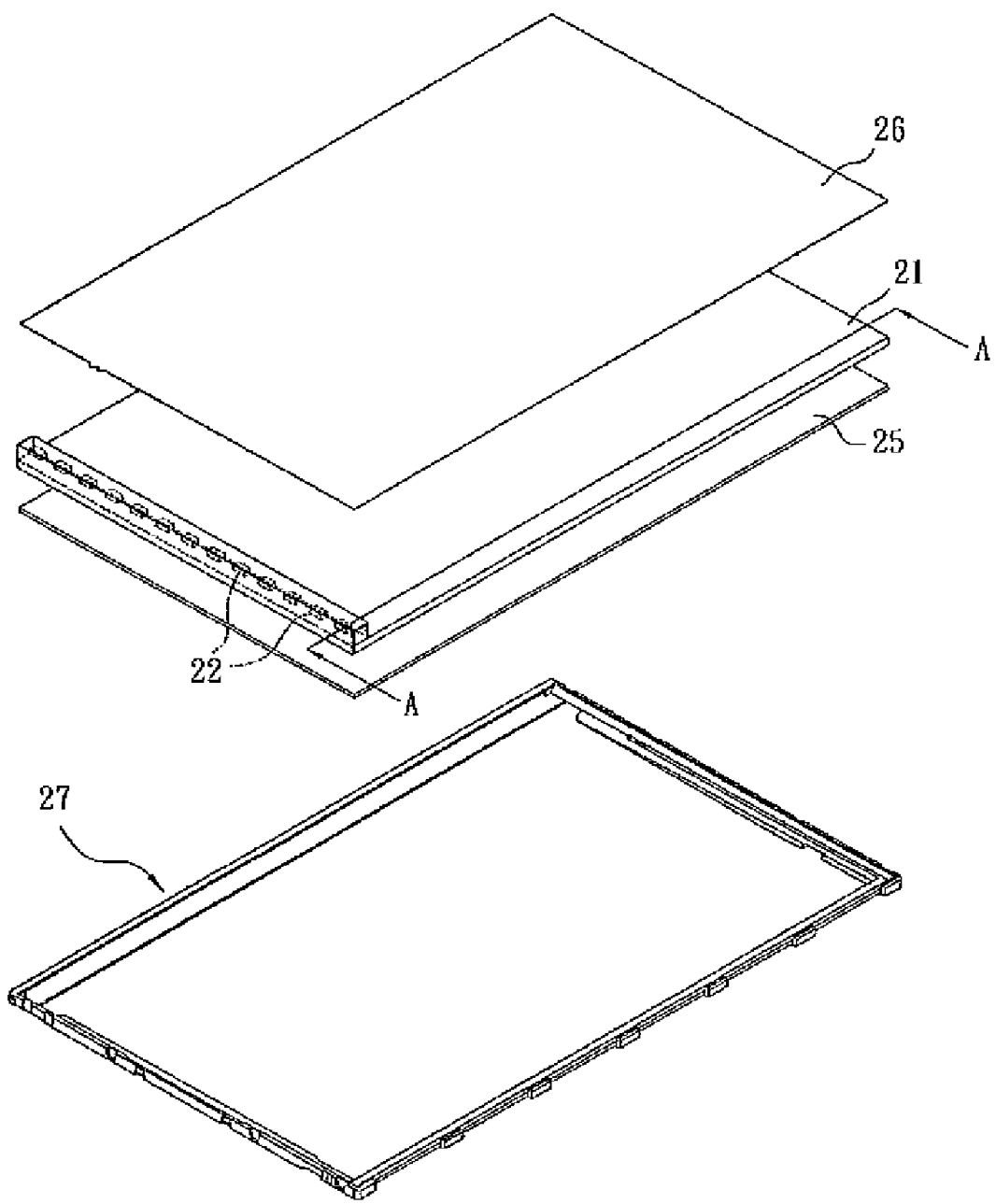
FIG. 3 is a schematic illustration showing a light emitting module according to a first embodiment of the invention.

Referring to FIG. 3, a light emitting module 2 according to the first embodiment of the invention includes a transparent substrate 21 and at least one light emitting diode (LED) 22. The light emitting module 2 may be an illumination module for daily illumination, a light source module of an electronic device (e.g., a scanner), a light source module of an outdoor display or a backlight module of a liquid crystal display device. In this illustrative embodiment, the light emitting module 2 is a backlight module of a liquid crystal display device.

Figure 4:
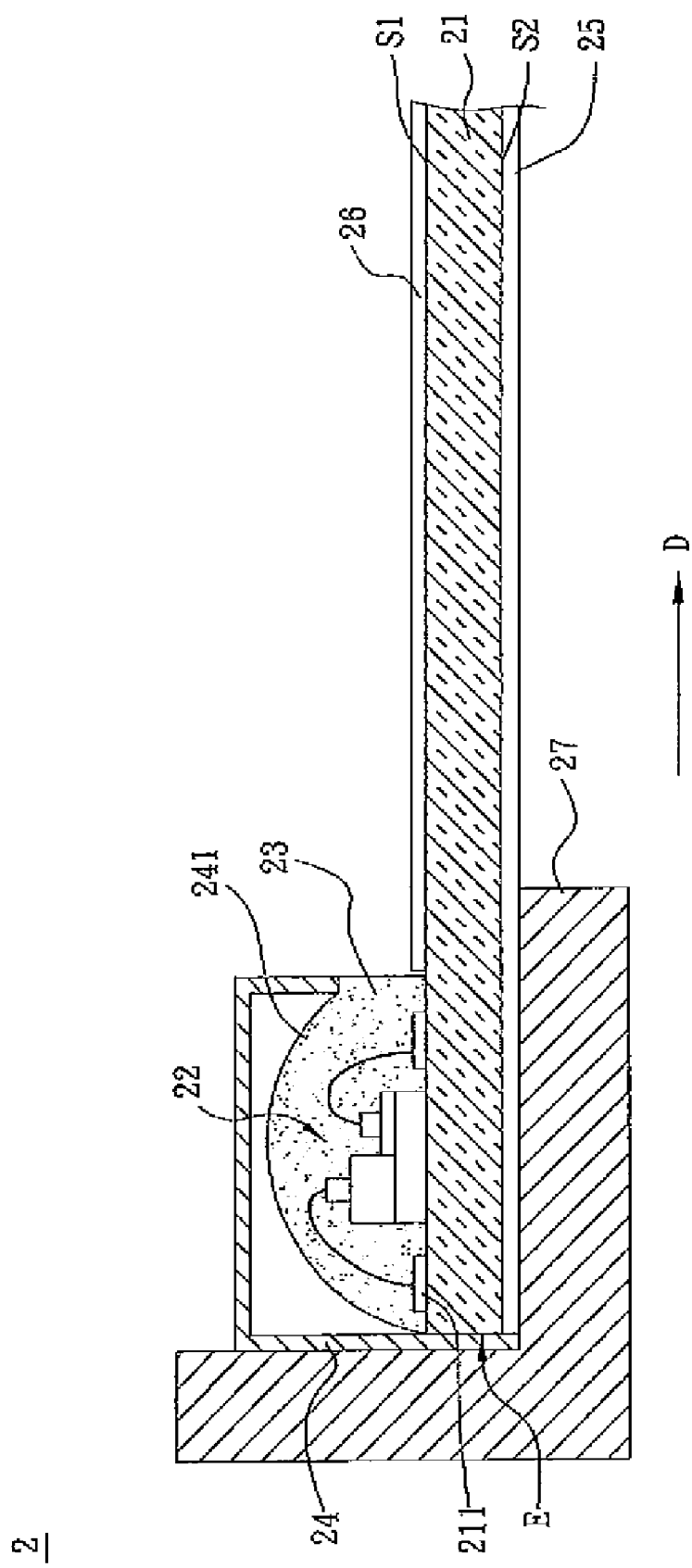
FIG. 4 is a schematically cross-sectional view taken along a straight line A-A after the light emitting module of FIG. 3 is assembled.

FIG. 4 is a schematically cross-sectional view taken along a straight line A-A after the light emitting module 2 of FIG. 3 is assembled. Referring to FIGS. 3 and 4, the transparent substrate 21 has a first surface S1, a second surface S2 disposed opposite to the first surface S1, and a patterned conductive layer 211 disposed on the first surface S1 of the transparent substrate 21. The material of the transparent substrate 21 may be glass, sapphire, silicon carbide, resin (e.g., polycarbonate or polymethylmethacrylate (PMMA)) or a plastic material. In this embodiment, the material of the transparent substrate 21 is glass, and the transparent substrate 21 functions to replace the LED package substrate and the light guide plate in the prior art.

The LED 22 is disposed on a lateral side of the first surface S1 of the transparent substrate 21. In this embodiment, a plurality of LEDs 22 (see the dashed line) is provided and arranged on the lateral side along a straight line. The LED 22 may be a LED device or a die. The LED 22 may be a white light LED, a ultra-violet ray LED, a red light LED, a green light LED or a blue light LED according to the light outputted therefrom. In this embodiment, the LED 22 is a die and outputs blue light. The LED 22 has the transparent substrate 21 serving as the package substrate, and is electrically connected with the patterned conductive layer 211 via leads by way of wire bonding. Of course, the LED 22 may also be electrically connected with the patterned conductive layer 211 by way of flip-chip bonding or surface mount bonding. For example, if the LED 22 is a LED device, its lead frame may be used for surface mount bonding. The patterned conductive layer 211 includes, for example but not limited to, a single metal layer or a plurality of metal layers.

Because the LED 22 has the transparent substrate 21 directly serving as the package substrate, the conventional alignment problem between the LED 22 and the light guide plate can be solved.

The light emitting module 2 may further include a package encapsulation body 23, which covers the LED 22 and the patterned conductive layer 211 to protect the electrical connection points from being oxidized or damaged by external forces. If the light emitting module 2 is configured to output white light, the package encapsulation body 23 may be doped with fluorescent powder. The material of the fluorescent powder may be selected according to the light outputted from the LED 22. For example, when the LED 22 outputs blue light, the selected fluorescent powder may be excited by the blue light to output yellow light. After the blue and yellow light rays are mixed, the light emitting module 2 can output white light.

Figure 5:
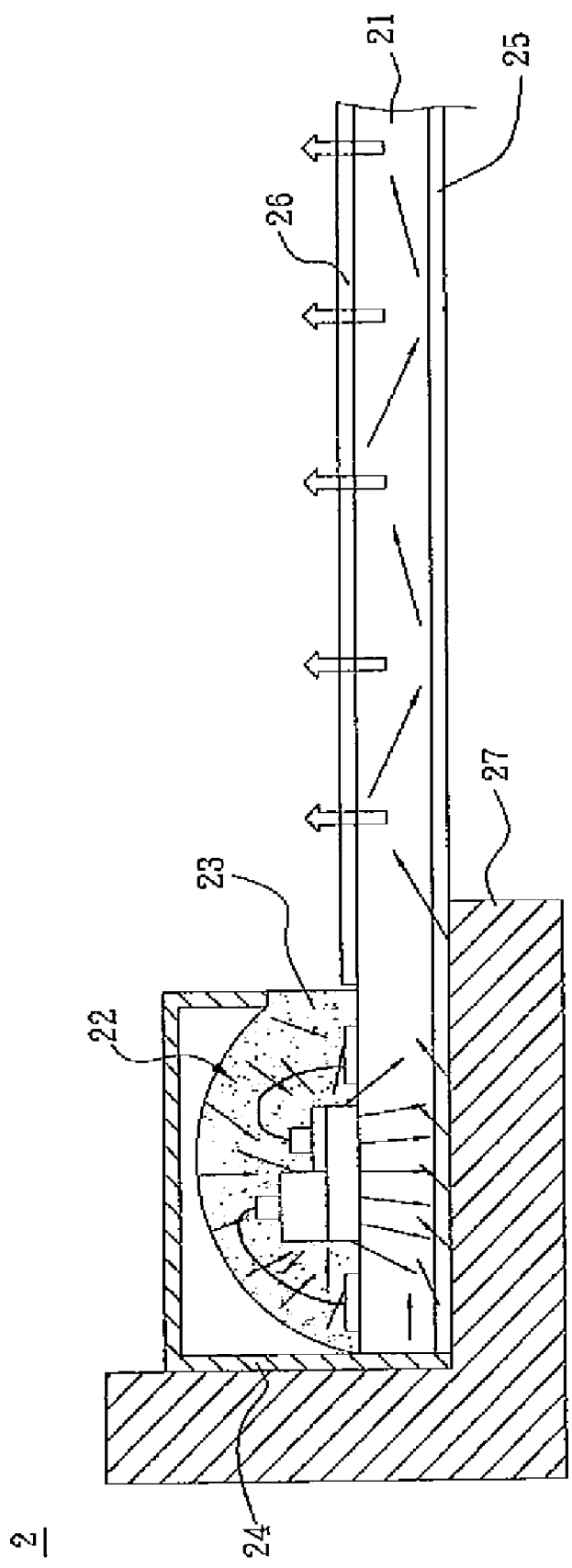
FIG. 5 is a schematic illustration showing a light emitting path of the light emitting module according to the first embodiment of the invention.

As shown in FIG. 5, the LED 22 of this embodiment is a bottom emitting type LED. That is, the light outputted from the LED 22 is mainly incident to the first surface S1 of the transparent substrate 21 downwards. The incident light is totally reflected inside the transparent substrate 21, and is conducted from a lateral side E of the transparent substrate 21 to the other side in a main conducting direction D of light. The conducting direction of light is mainly perpendicular to an arrangement direction of the LEDs. It is to be noted that the main conducting direction D of light is not the light output direction of the light output surface, but is the direction along which the light is guided and diffused in the transparent substrate 21. When the incident angle of the light is smaller than the total reflection angle, the light is emitted from the first surface S1 of the transparent substrate 21. In order to break the total reflection phenomenon of the light in the transparent substrate 21, a dot pattern (not shown) may be disposed on the second surface S2 of the transparent substrate 21 opposite to the first surface S1. In addition, the pattern density of the dot pattern may be adjusted according to the distance to the LED 22 so that the light emitted from the transparent substrate 21 is a uniform plane light source. Moreover, a roughened surface may be formed on the first surface S1 of the transparent substrate 21 other than the patterned conductive layer 211 by way of post processing in order to break the total reflection phenomenon of the light in the transparent substrate 21.

In this embodiment, the light emitting module 2 may further include an optical film 26 and a frame 27 disposed on the first surface S1 of the transparent substrate 21. The optical film 26 may be a diffuser plate, a diffuser sheet or a brightness enhancement film for assisting in homogenizing the light emitted from the transparent substrate 21. The refractivity of the optical film 26 may range between those of glass and air. Consequently, the interface between the transparent substrate 21 and the optical film 26 prevents the light from being totally reflected back to the transparent substrate 21 due to the significant difference between the refractivities. The frame 27 is a hollow rectangular frame, for example, and the transparent substrate 21 is accommodated in the frame 27. Of course, the shape of the frame 27 is not particularly restricted, and the frame 27 may also be a backpanel of a backlight module.

Referring again to FIG. 4, the light emitting module 2 may further include a reflective device 24 and a reflective sheet 25 in order to enhance the light availability. The reflective device 24 has a chamber 241 and is combined with the transparent substrate 21 by way of screwing, riveting, engaging or adhering, for example, and the reflective device 24 can cover an end surface E of the transparent substrate 21 to prevent the light from being emitted from the end surface E and thus to enhance the light availability. The LED 22 is disposed in the chamber 241. The reflective device 24 can reflect the light, which is emitted upwards from the LED 22, to the transparent substrate 21. In this embodiment, the reflective device 24 is a lamp shade, and an inner wall of the lamp shade may have a reflective layer. The shape and the material of the lamp shade are not particularly restricted. Any shape of the lamp shade can be adopted as long as the lamp shade can cover the LED 22, and the material of the lamp shade may be metal, an alloy or a plastic material. Different shapes of the lamp shades may be adopted such that the reflective device 24 can reflect the light of the LED 22 to produce the parallel light or the non-parallel light, which is incident to the transparent substrate 21. For example, if the LED 22 is placed on a focus of the reflective device 24, the parallel light can be produced. The package encapsulation body 23 is filled into the chamber 241 of the reflective device 24. During the manufacturing process, the package encapsulation body 23 may be injected into the chamber 241 via an opening of the reflective device 24. In addition, the reflective sheet 25 is disposed adjacent to the second surface S2 of the transparent substrate 21 so as to reflect the light, which is leaked from the second surface S2 of the transparent substrate 21, back to the transparent substrate 21. Thus, the light availability may also be enhanced. Of course, the transparent substrate 21 may also guide the light, which is outputted from the LEDs 22, to be outputted from the second surface S2, and the light outputted from the second surface S2 is reflected, by the reflective sheet 25, back to the transparent substrate 21 for reuse. Therefore, if the reflective sheet 25 is disposed on the first surface S1, the light outputted from the LEDs 22 may be outputted from the second surface S2.

Figure 6:
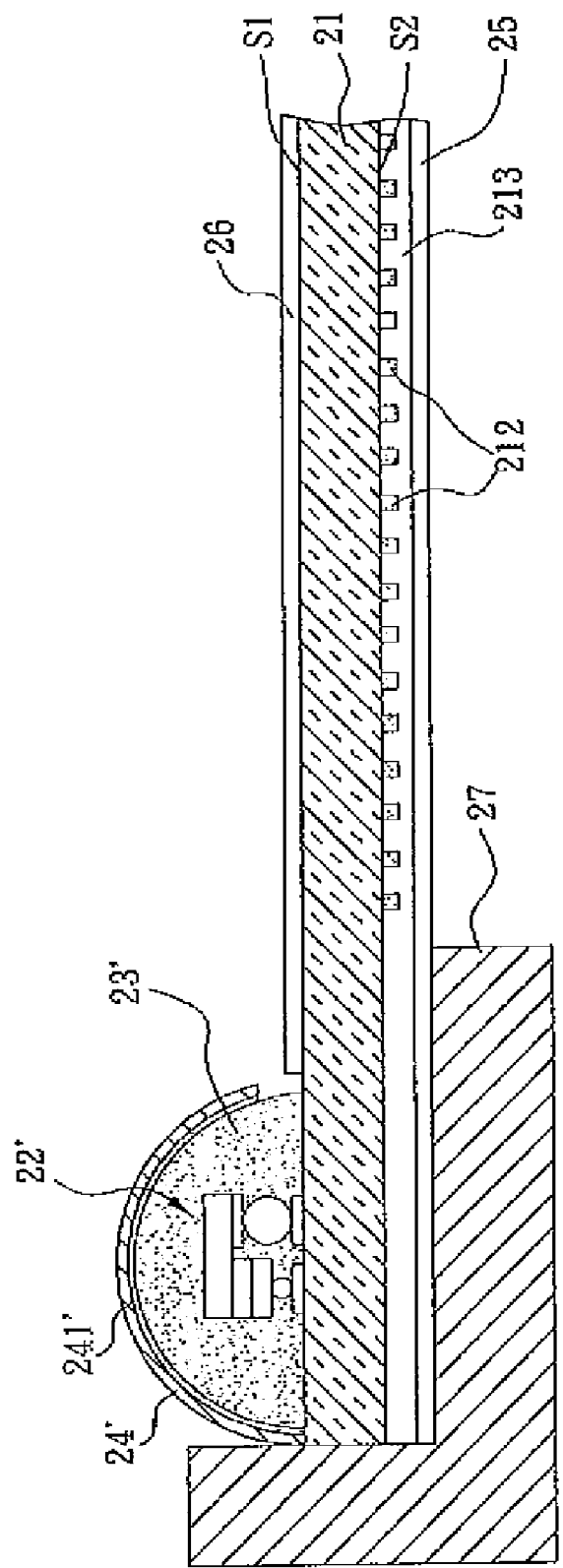
FIG. 6 is a schematic illustration showing another light emitting module according to the first embodiment of the invention.

As shown in FIG. 6, the difference between a light emitting module 2' and the light emitting module 2 is in that a LED 22' of the light emitting module 2' is bonded to the transparent substrate 21 by way of flip-chip bonding, and the fluorescent powder is coated on a reflective layer 242 on an inner wall of a reflective device 24'. Alternatively, a fluorescent patterned layer 212 is formed on the second surface S2 of the transparent substrate 21. The fluorescent patterned layer 212 may be a dot structure with a fluorescent body. The blue light outputted from the LED 22' may be excited by the fluorescent powder on the reflective layer 242 of the reflective device 24'. Alternatively, the light can be emitted to the second surface S2 of the transparent substrate 21, and then excited by the fluorescent patterned layer 212 to form the yellow light so that the yellow light and the blue light are mixed in the transparent substrate 21 to produce the white light. In order to protect the fluorescent patterned layer 212 formed on the second surface S2 of the transparent substrate 21, the transparent substrate 21 may further have a protection encapsulation layer 213 covering the fluorescent patterned layer 212 to prevent the fluorescent patterned layer 212 from being detached.

In addition, the reflective device 24' and the reflective device 24 of FIG. 4 have different shapes, and the cross-sectional area of the reflective device 24' has an arc shape.

Figure 7:
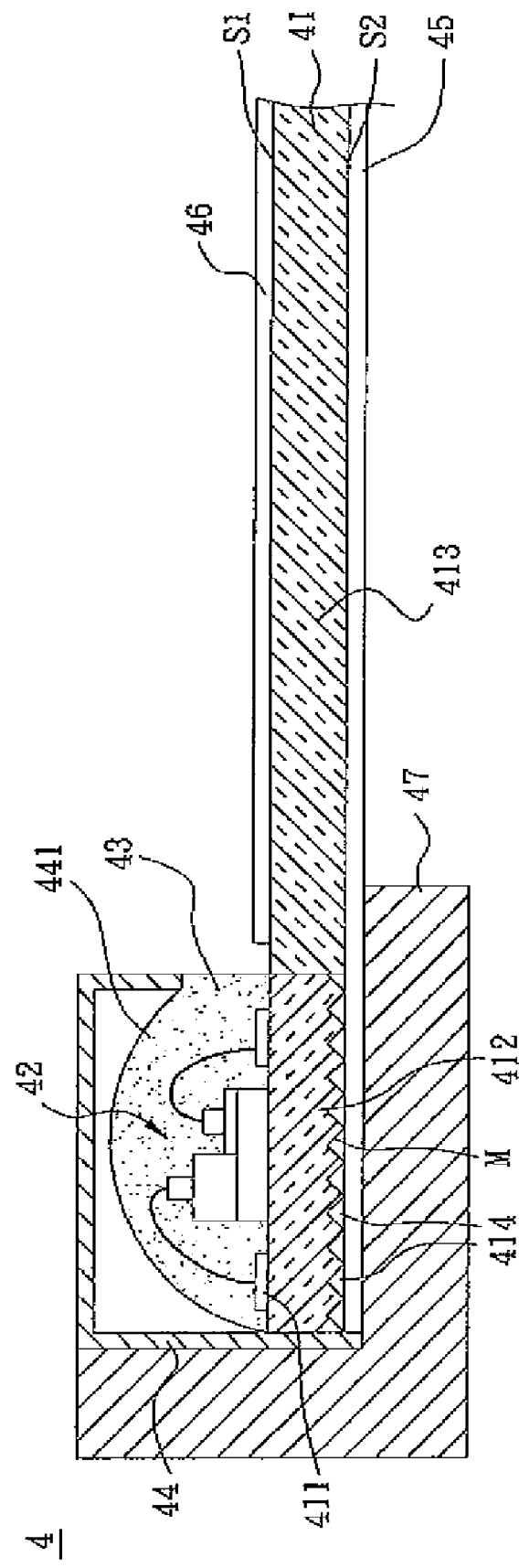
FIG. 7 is a schematic illustration showing a light emitting module according to a second embodiment of the invention.

Next, a light emitting module 4 according to a second embodiment of the invention will be described with reference to FIG. 7.

The light emitting module 4 includes a transparent substrate 41 and at least one LED 42. The transparent substrate 41 has a patterned conductive layer 411 disposed on a first surface S1 of the transparent substrate 41. The LED 42 is disposed on the first surface S1 of the transparent substrate 41 and is electrically connected with the patterned conductive layer 411.

The difference between the second and first embodiments is in that the transparent substrate 41 has a first substrate body 412 and a second substrate body 413, which are arranged in parallel. The patterned conductive layer 411 is disposed on the first substrate body 412. The material of the first substrate body 412 is glass or resin, and the material of the second substrate body 413 is glass, sapphire, silicon carbide, resin or a plastic material. In addition, the first substrate body 412 has a micro structure M disposed opposite to the LED 42 to help the light, which is emitted from the LED 42, enter the transparent substrate 41. The cross-sectional area of the micro structure M may be a V-shaped groove or an arc groove. Of course, the micro structure M may also be configured to have a concave-convex pattern according to the actual product requirement. Because the glass has higher hardness and cannot be easily post-processed, the first substrate body 412 and the second substrate body 413 may have different materials in order to facilitate the processing of forming the micro structure M. For example, the material of the first substrate body 412 may be resin, which is easily processed. In addition, the first substrate body 412 may be formed by way of injection molding, rolling or pressing, and the material of the second substrate body 413 may be glass.

In addition, optical resin 414 may also be filled in between the micro structure M of the first substrate body 412 and a reflective sheet 45 in order to prevent the light from being totally reflected back to the first substrate body 412.

In summary, the light emitting module of the invention has the transparent substrate serving as the LED package substrate. Compared with the prior art, the light emitting module according to the first embodiment of the invention has the transparent substrate serving as the LED package substrate and the light guide plate. Therefore, the problem of the prior art that the alignment between the LEDs and the Light guide plate cannot be easily achieved can be solved, and the material cost and the assembling time of the light emitting module can be decreased due to the decreased number of assembled members. Furthermore, in the light emitting module according to the embodiment of the invention, the light outputted from the bottom surface of the LED chip directly penetrates through the transparent substrate and then enters the light guide plate, or directly penetrates through the first substrate body and then enters the second substrate body to form the plane light source. Because it is unnecessary to plate the reflective layer on the surface of the lead frame to reflect the light, the light availability is enhanced. In addition, the transparent substrate or the first substrate body in the light emitting module according to the embodiment of the invention is made of the glass material, which is cheaper than the conventional light guide plate.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light emitting module, comprising:
   a transparent substrate having a first surface, a second surface disposed opposite to the first surface, and a patterned conductive layer disposed on the first surface; and a plurality of light emitting diodes (LEDs) disposed on a lateral side of the first surface of the transparent substrate and electrically connected with the patterned conductive layer, wherein light emitted from the LEDs is guided by the transparent substrate and outputted from the first surface.

2. The light emitting module according to claim 1, wherein a material of the transparent substrate comprises glass, sapphire, silicon carbide, resin or a plastic material.

3. The light emitting module according to claim 1, wherein the transparent substrate has a micro structure or a concave-convex pattern, and the micro structure or the concave-convex pattern is disposed opposite to the LEDs.

4. The light emitting module according to claim 1, wherein the transparent substrate has a first substrate body and a second substrate body connected and parallel to each other.

5. The light emitting module according to claim 4, wherein the patterned conductive layer is disposed on the first substrate body.

6. The light emitting module according to claim 4, wherein the first substrate body has a micro structure or a concave-convex pattern, and the micro structure or the concave-convex pattern is disposed opposite to the LEDs.

7. The light emitting module according to claim 1, wherein the transparent substrate further has a fluorescent patterned layer disposed on the second surface.

8. The light emitting module according to claim 7, further comprising:

a reflective sheet disposed adjacent to the second surface of the transparent substrate.

9. The light emitting module according to claim 1, wherein the LEDs are bonded to the patterned conductive layer by way of wire bonding, flip-chip bonding or surface mount bonding.

10. The light emitting module according to claim 1, further comprising:

a reflective device having a chamber, wherein the reflective device is combined with the transparent substrate, and the LEDs are disposed in the chamber.

11. The light emitting module according to claim 10, wherein the reflective device is combined with the transparent substrate by way of screwing, riveting, engaging or adhering.

12. The light emitting module according to claim 10, further comprising:

a package encapsulation body filled into the chamber and doped with fluorescent powder.

13. The light emitting module according to claim 10, wherein the reflective device is a lamp shade, an inner wall of the lamp shade has a reflective layer, and fluorescent powder is coated on the reflective layer.

14. The light emitting module according to claim 1, wherein the first surface without covering by the patterned conductive layer is a roughened surface.

* * * * *